United States Patent
Zhang et al.

[11] Patent Number: 5,903,154
[45] Date of Patent: May 11, 1999

[54] BATTERY TEST CONTACT ASSEMBLY

[76] Inventors: Chaojiong Zhang, 4615 Valleybrook, College Station, Tex. 77845; Dennis Piwonka, Rte. 5 Box 204, Caldwell, Tex. 77836

[21] Appl. No.: 08/953,334

[22] Filed: Oct. 17, 1997

Related U.S. Application Data

[XX .
[60] Provisional application No. 60/042,816, Apr. 8, 1997.

[51] Int. Cl.⁶ .................................................. G01R 31/36
[52] U.S. Cl. ........................................ 324/437; 439/377
[58] Field of Search .................................. 439/219, 362, 439/378, 377; 324/437, 538

[56] References Cited

U.S. PATENT DOCUMENTS

| | | | |
|---|---|---|---|
| 3,736,498 | 5/1973 | Skutch | 324/437 |
| 4,204,161 | 5/1980 | Strickland . | |
| 4,360,780 | 11/1982 | Skutch | 324/437 |
| 4,377,786 | 3/1983 | Paul | 324/437 |
| 4,451,791 | 5/1984 | Ostroff | 324/437 |
| 5,512,833 | 4/1996 | Fukuda | 324/538 |
| 5,586,900 | 12/1996 | Yagi | 324/538 |
| 5,701,079 | 12/1997 | Yagi | 324/538 |

FOREIGN PATENT DOCUMENTS

| | | |
|---|---|---|
| 9099271 | 6/1984 | Japan . |
| 7097004 | 4/1995 | Japan . |
| 7226234 | 8/1995 | Japan . |

*Primary Examiner*—Josie Ballato
*Assistant Examiner*—Jose M. Solis
*Attorney, Agent, or Firm*—Gunn & Associates P.C.

[57] ABSTRACT

A battery test contact clamp assembly is set forth. In one embodiment, upper and lower printed circuit boards are spaced apart on four corner located mounting rods of conductive metal. The four rods pass through one of the boards and are held to it by a set of detents and four hubs located at corners to thereby define a rectangular structure where the boards can move closer together or further apart. Frictional mounting hubs are used for the four rods. They are connected electrically in a circuit which involves contact assemblies on the two boards and they are aligned with battery terminals for contact to thereby define an electrical flow path with a test circuit. The contacts are aligned with the battery terminals. Alternative embodiments include two boards with multiple conducting rods there between and they are connected in several independent test modules. Another embodiment features two test contacts mounted on a common board for testing of batteries having two terminals at one end of the battery.

20 Claims, 3 Drawing Sheets

U.S. Patent    May 11, 1999    Sheet 1 of 3    5,903,154
FIG.1
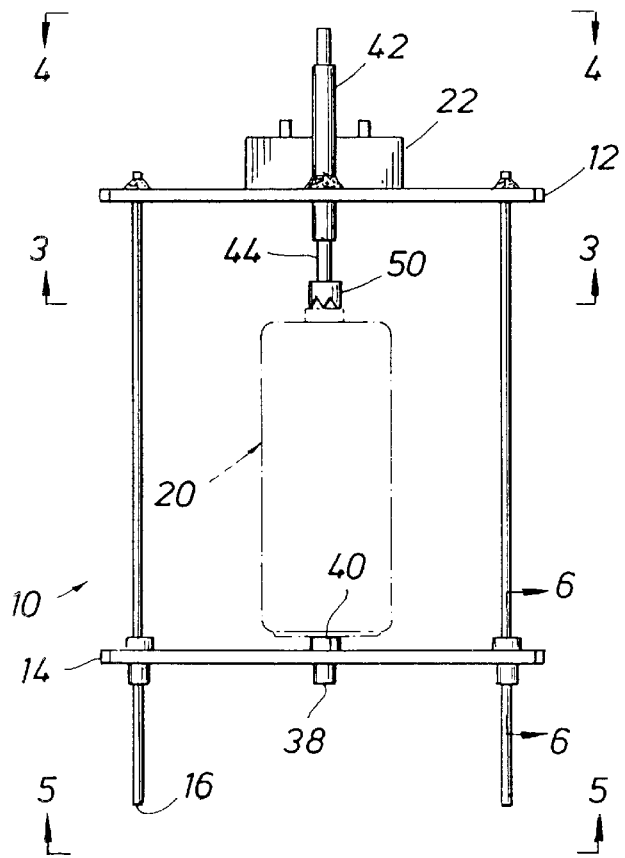
FIG.2
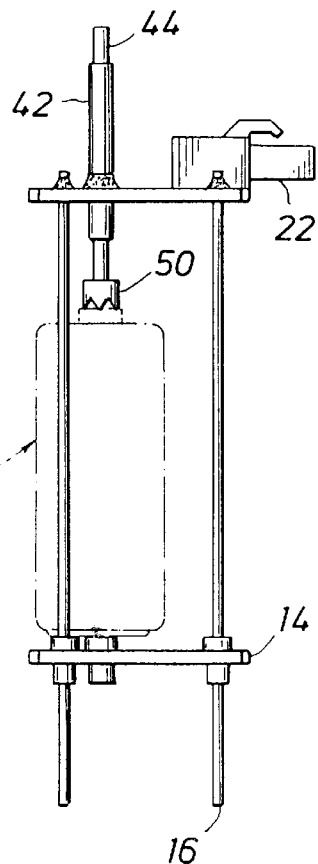
FIG.3
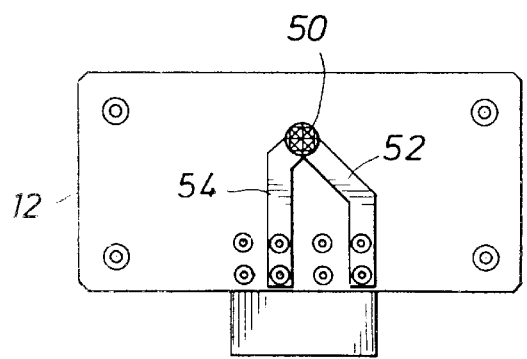
FIG.4
FIG.5
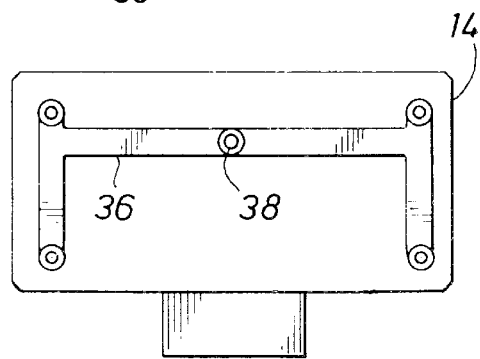

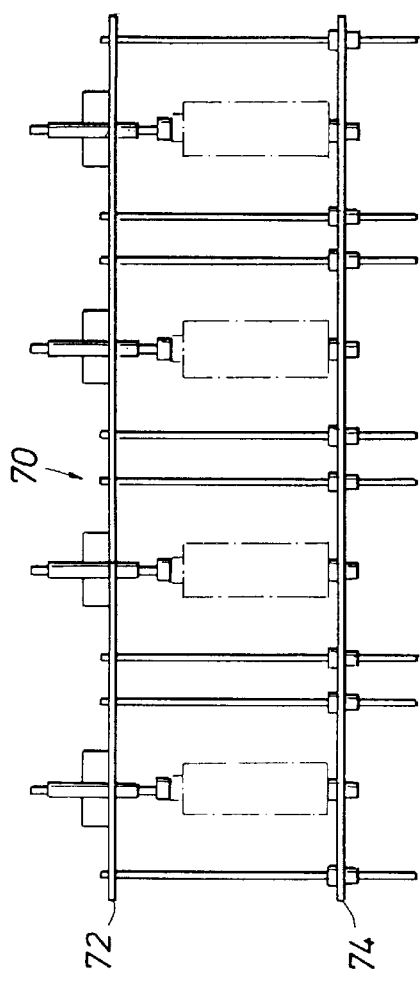
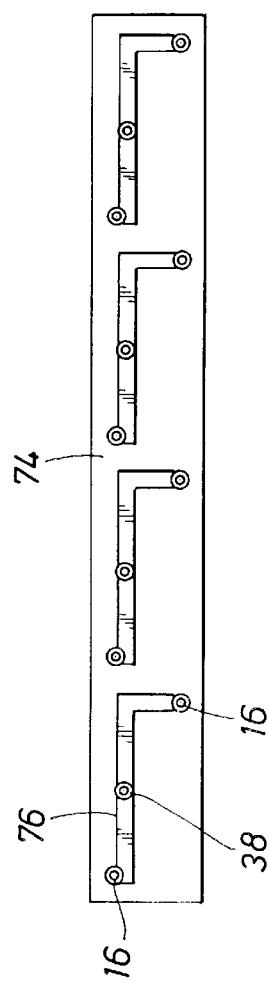
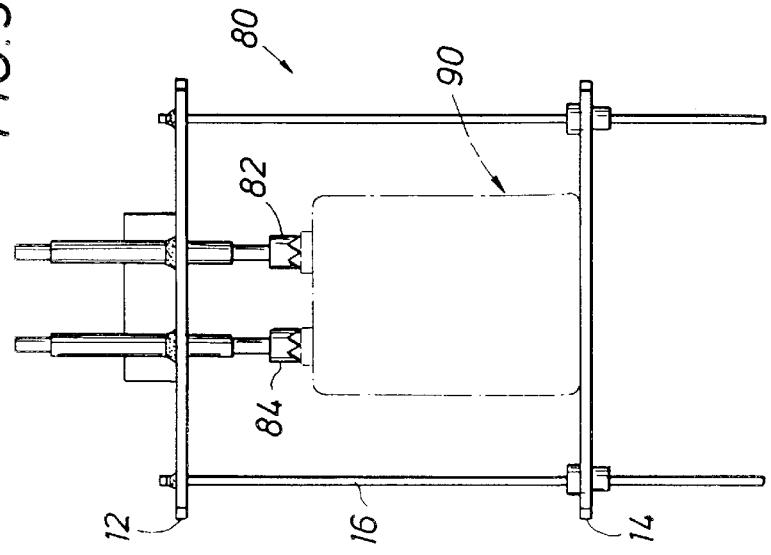
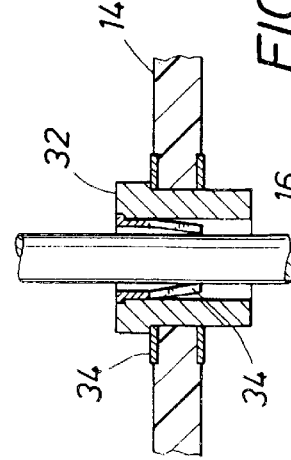

5,903,154

BATTERY TEST CONTACT ASSEMBLY

This application has the effective filing date of provisional application Ser. No. 60/042,816 which was filed on Apr. 8, 1997.

FIELD OF THE PRESENT DISCLOSURE

In the production of small batteries, it is necessary to test at least selected samples of a manufacturing run. Sometimes, it may be important to test every battery made in a manufacturing facility. It is not uncommon for a manufacturing plant to manufacture batteries in any number of sizes. To be sure, there are common sizes such as a D cell, or perhaps an AA cell. In both instances, they are constructed as elongate cylindrical bodies with terminals at the opposite ends. They do, however, differ in diameter, and just as importantly in terms of testing, they can differ in thickness. They are constructed with positive and negative terminals which are at opposite ends. The terminal spacing will vary with length. The battery contact assembly of the present disclosure enables a single test assembly to accommodate batteries over a wide range of sizes and shapes. In a first embodiment, positive and negative contact terminals are deployed opposite one another and are positioned to clamp against the positive and negative terminals at the ends of the batteries. This is accomplished without regard to the length of the cylindrical battery. Testing is accomplished for longer batteries as well as those which are shaped like a button. Indeed, there are a number of extremely short batteries, those shaped like a button or small disk.

For testing, it is necessary to connect to the battery terminals with a high quality connection. The quality of the connection is normally assured by controlling the spring force of the spring which forces the battery contact against the terminal. Elaborating, suitable contact with test terminals is required to assure that accurate test data can be obtained. Should the contact force be outside a desired range, false readings may be obtained because the contact is not sufficient to enable full current flow between the battery terminal and the battery contact. The contact assembly of the present disclosure provides appropriate contact to the battery. Moreover, it is an adjustable structure which can be set momentarily for a specific length of battery and yet which will maintain that length for many cycles of testing. Later, when testing another battery length, the test assembly can be adjusted so that the length of the battery is accommodated. Since battery production usually involves thousands of batteries per day, it is sometimes desirable to replicate the test equipment. In one embodiment of the present disclosure, several units are deployed together for testing of several batteries. Again, they collectively can be adjusted to accommodate first one battery length and then another.

In a second embodiment of the present disclosure, all battery terminals are located at one end of the battery. In that instance, the battery can be rectangular, square or circular in cross-section. The battery construction features two terminals as before but they are deployed at only the common end.

Battery testing involves substantial current flows. The current flow must be provided through some kind of test circuit. Such a test circuit features two aspects, one being a load for the battery and the other being a current source. Batteries must be tested by providing timed charging current and discharge current in typical tests. Such tests are calculated to test the quality of the battery production. Therefore, a current is drained from the battery. Another aspect of testing is applying a current to the battery. These are controlled for a timed interval at selected current levels.

BRIEF SUMMARY OF THE PRESENT DISCLOSURE

This disclosure is directed to a battery terminal clamp apparatus so that proper contact with battery terminals is made. Variations in size are accommodated. The system enables the tester to releasably clamp to and then release batteries during repetitive testing. Changes in battery length are accommodated by the test equipment. A first embodiment handles batteries with terminals at opposite ends while a second version tests batteries where both terminals are at a common end.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a front view of a battery test clamp apparatus for contacting battery terminals at the top and bottom and further illustrating a system for accommodating batteries of different lengths;

FIG. 2 is a side view orthogonal to the drawing of FIG. 1;

FIG. 3 is a sectional view along the line 3—3 of FIG. 1 showing the bottom side of an upper mounting board;

FIG. 4 is a top view of the mounting board shown in FIG. 3 and is taken along the sectional cut line at 4–4;

FIG. 5 is a bottom view of the bottom board shown in FIG. 1;

FIG. 6 is an enlarged sectional view along the line 6—6 of FIG. 1 showing an adjustable clamp on a current conducting rod;

FIGS. 7 and 8 are the front and bottom views of a multiple battery testing unit showing the first embodiment for testing simultaneously several batteries;

FIG. 9 is a view similar to FIG. 1 showing a second embodiment for testing batteries where both battery terminals are at one end of the battery.

DETAILED DESCRIPTION OF THE FIRST EMBODIMENT

Figure 10:
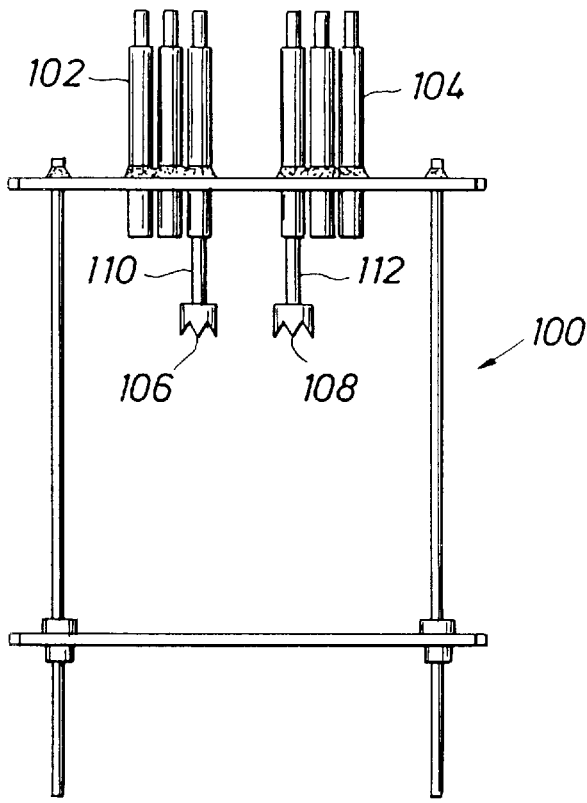
FIGS. 10, 11 and 12 show another embodiment having adjustable width contacts and also show changes in board spacing.

Attention is directed to FIG. 1 of the drawings where a first battery tester is identified generally at 10. The battery tester 10 is constructed with a pair of parallel printed circuit boards (PCB below) which are identified by the numerals 12 and 14. They are spaced from one another by a set of conductor rods 16 as will be detailed. The conductor rods provide current conductor paths arranged in parallel as will be explained. The spacing of the PCBs 12 and 14 is defined by a mechanism which will be explained to accommodate a battery undergoing tests and generally identified at 20. The battery or cell 20 is shown with a representative length in the drawings which can vary widely. The battery 20 can be as thin as a button and can be as long as the current conductor rods 16 will permit. As length is increased, changes in length are accommodated by moving the PCB 14 away or toward the top PCB 12. The length of travel is limited only by the length of the rods 16 which can be fabricated to any desired length.

Going specifically to FIG. 4 of the drawings, the top board 12 is shown in greater detail. It supports a connector 22. The connector features two terminals 24 and 26 so that circuit connections can be made to the test fixture 10. The terminals 24 and 26 connect to test circuitry. The test circuitry provides a controlled resistance across the battery, i.e., some resistance ranging from as large as needed to substantially near zero so that the current flow can be tested. Typically, the test circuitry will include an ammeter. The test circuitry typically also features a current source to impose a charging current on the battery. This is especially important in testing rechargeable batteries. For instance, it may be necessary to test a rechargeable battery by providing a controlled discharge through a low resistance and then a charging current is applied to the cell. The test circuit is implemented by connection to the terminals 24 and 26 which are on the connector 22. FIG. 4 represents the test circuit as comprising a timer connected resistor and current source. They are timed in operation so that various test routines can be done.

The board 12 is connected with four of the posts 16. They are deployed in a rectangle and extend up through the board 12 and are electrically connected to the board 12, using solder to make the connections. The four posts are connected in parallel so that they have a common circuit connection by the conductive strip 28. The strip 28 is electrically joined to the solder covered eyelets 30 which are eyelets used in PCB construction. The board 12 is preferably provided with plated-through holes and eyelets. Such construction is well known in PCB fabrication. The eyelets 30 assure current flow between the two faces of the board. In this particular instance, the connection at the eyelet 30 is accomplished by soldering to the rod 16. The rod 16 serves two purposes. In one aspect, it is a current conductor and is preferably made of a quality conducting metal. Ideally, it is copper, and more preferably a copper alloy. There are four in the preferred embodiment which assures parallel positioning of the boards 12 and 14. The rods 16 are fixedly attached to the board 12. Since the rods 16 are fixed to the board 12, they do not accommodate relative movement with the board. Relative movement is provided for the board 16. It is moved upwardly or downwardly (referring to its position in FIGS. 1 and 2) so that the board 12 can be raised or lowered to handle changes in battery length. These changes are associated with a change in model being tested.

FIG. 6 illustrates an important structural detail of the construction. The rod 16 is shown in FIG. 6 passing through an assembly accommodating positional changes. FIG. 6 illustrates the PCB 14 which supports a mounting hub 32. It has the form of a metal sleeve with shoulder. It is soldered to connect with the current conductor path 34' on the lower board 14. The mounting hub (having the form of a sleeve) Supports an insert which positions a set of detents 34 for deflection radially inwardly to contact, grip and drag against the rod 16. The detents provide frictional slippage of a controlled amount. The precise amount will be detailed hereinafter. The detents provide a completed current flow path into the rod 16. Electrical continuity is therefore obtained between the conductive path 36 on the board (see FIG. 5) and the rod 16 through the detents, which clamp around the rod 16. Detent construction features a springy member which flexes to accommodate rod movement as required. The rod is pushed in or out of the detents 34. When motion ends, clamping is continued until the next time the rod is moved. The grasp of the detents 34 is sufficient to assure high quality electrical contact. Also, it is helpful to assure the electrical current flow path just mentioned.

Going now to the lower board 14, it is shown in FIG. 5 which includes a current conductor path 36 which connects the four rods in parallel. All four of the rods are connected in common. One important aspect of this connection is the ground connection. Assume for purposes of definition that the ground terminal of the battery 20 is at the lower end. This involves the location of the mounting post 38 shown in FIG. 5 which extends through the board 14. The negative or ground terminal is on the top side of the board at 40, see FIG. 1. Current for the ground terminal from the battery is directed through the terminal 40. The ground connection is completed to the ground terminal 24 in the connector 22. The ground terminal 40 thus connects through the mounting post 38, through the conductive ribbon 36 on the bottom board 14 and then to the rods 16 through the detent mechanism 34 (see FIG. 6). Current is conducted upwardly through the several rods 16 to the top board 12. The top board is better shown in FIG. 4 where the conductor path 28 connects with the four rods at the respective corners of the rectangular boards 12 and the conductor path 28 is connected to a terminal in the connector 22.

As shown in FIG. 1 of the drawings, the battery ground terminal 40 is centered in the structure and is deployed so that it contacts the bottom terminal. Contact of the top of the battery is also shown in FIG. 1. More specifically, a mounting sleeve 42 supports a movable contact rod 44 which is forced downwardly by a spring on the interior of the sleeve 42. The rod 44 supports the top battery contact 50. The contact 50 has a relatively large contact area and is typically serrated so that it bears with several points on the terminal of the positive battery 20. It moves upwardly and downwardly. The force on the spring moves it downwardly against the battery for testing.

The sleeve 42 is fixed on the board 12 by solder. As shown in FIG. 3, the sleeve is connected electrically to a conductive path 52 on the bottom of the board 12. Moreover, the conductor 52 extends from the sleeve to complete the circuit through the connector 22. Typically, a single conductor path 52 will suffice. It can, however, be assisted by providing a second conductor path 54, and a second parallel current flow path. The conductors 52 and 54 can therefore connect with a single terminal in the connector 22. In this particular instance, the positive terminal of the battery 20 undergoing test is contacted by the movable contact assembly 50 which bears against the battery for such connection.

Operation of the embodiment 10 should now be considered. First, the length of the battery 20 is measured. Spacing between the facing contacts 40 and 50 is then considered. The contact 50 should be positioned so that it moves against the battery 20. When that occurs, proper contact is achieved on mounting the battery 20 between the contacts 40 and 50. This adjustment in position may require movement of the board 14. The board 14 is pushed evenly up or down as required so that it slides on the mounting rods 16. The several rods 16 serve two purposes. For one, they provide parallel positioning of the two boards. This is maintained even when the boards are relatively moved to change spacing. In addition to that, the rods are current conductors. Collectively, they provide current flow along the rods so that the output of the system is easily obtained through the connector 22. The terminals 24 and 26 provide these connections A completed current flow path is made through the test circuit. For instance, if a short were connected across the terminals 24 and 26 (and effectively that is done in one aspect of testing), then current flows from the positive terminal of the battery contacted at the top end. This involves the contact 50. Current will flow from the positive terminal, and ultimately back to the ground terminal 40 through the conductors 16. The conductors 16, being structurally arranged as posts, serve the purpose of completing the circuit in the system. Current flow through the posts 16 is accomplished from the board 12, the posts 16 and to the board 14. Current flows through the detents 34 which grasp the rods 16.

The detent assembly shown in FIG. 6 enables current flow as just mentioned and also enables repositioning. The four detent assemblies holding or grasping the four rods 16 must hold with sufficient force to overcome the weight of the battery 20 plus the downward force applied at the contact 50. Typically, finger strength is all that is required to move the board 14 up or down. It slides on the rods. Sliding movement is accomplished easily to reset the board 14 for changes in battery length. It can be pushed up as viewed in FIG. 1 until the contact 40 bears against the moveable contact 50. When that occurs, the contact 50 can still be raised to slide a button thick battery between the two contacts.

An alternate embodiment is shown in FIGS. 7 and 8 considered together. The embodiment 70 utilizes the structure shown in FIG. 1 and replicates it with a common board 72 positioned parallel to a lower common board 74. The boards 72 and 74 correspond to the individual boards 12 and 14 just described. The embodiment 70 does not require four of the mounting rods 16 for each test module. FIG. 7 shows four different test modules. Ordinarily, this would require sixteen of the mounting rods shown in FIG. 1, but with longer boards, fewer rods are needed. Moreover, adequate current flow can be obtained with about two rods per module. Elaborating, the four rods shown in FIG. 1 are connected in parallel but only two rods are needed in FIG. 7. Going to FIG. 8, the current conductor path 76 connects with the bottom post 38 at the central portion of the conductor 76, and connects with two rods at the remote ends. There are four rods along one edge of the board 74 and four rods along the opposite edge. This defines four isolated test modules for the embodiment 70. Four batteries can be tested simultaneously. If desired, only one or two batteries can be tested in the device. Whether all modules are in use at a given moment or not the individual test modules are electrically isolated because the boards 72 and 74 are fabricated of non conductive material. This deployment of four test modules therefore assists in isolating the four batteries and four test circuits. As before, several batteries can be tested in a batch, and then the boards 72 and 74 are repositioned to test batteries which are shorter or taller.

Now, attention is directed to FIG. 9 of the drawings where an embodiment 80 is illustrated for testing a battery 90 which has two terminals at one end. The embodiment 90 is structurally constructed in the same fashion as the embodiment 10 shown in FIG. 1. This requires the top board 12, the lower board 14 and the four rods 16 which connect in the same manner illustrated in FIG. 6 of the drawings. The lower board 14, however, need not have electrical conductors on it and does not need to connect electrically to the rods 16. Rather, the upper board 12 is constructed with duplicate terminal contacts 82 and 84. These are mounted in the same fashion as discussed with the embodiment 10 and differ only in that two are located on the board 12. In this embodiment 12, the rods are structurally involved but not electrically in the test circuit. The embodiment 80 is assured of electrical contact. The battery test clamp 80 is adjusted in the same fashion as before.

One variation in the present apparatus is the incorporation of a voltage probe central to the positive terminal contact 50. In that instance, it is desirable to have two leads or conductors out of the positive battery terminal. One is obtained by a large footprint contact area against the positive battery terminal so that the current flow is directed through that. A second contact point to the positive terminal provides terminal voltage output through an appropriate conductor. Two contacts, one with large surface area and the other with small surface area can be deployed in a concentric construction as illustrated in co-pending application Ser. No. 08/953,334. In that particular version, two conductors are thus involved in the movable contact assembly 50. While one carries the current, the other provides a voltage signal. It is generally better to measure the voltage with an independent point of contact to the battery terminal. This results from the desire to have a separate signal path for voltage measurements. Battery testing normally involves substantial momentary current flows through the current flow path connected With the battery. In contrast, the signal path for voltage measurements involves a current flow of an infinitely small amount, typically 1 microampere or less depending on the quality and nature of the voltage measuring circuit. Suffice it to say, the voltage measurement terminal or point of contact should have little involvement in the current flow path.

Figure 12:
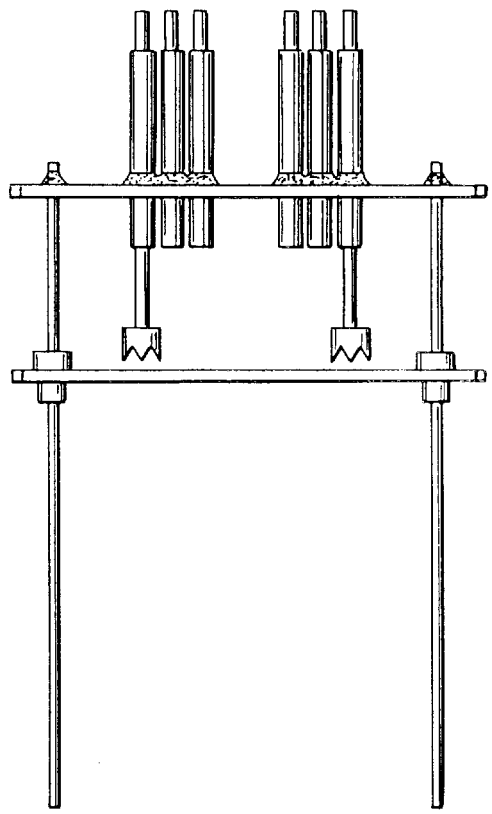
Figure 11:
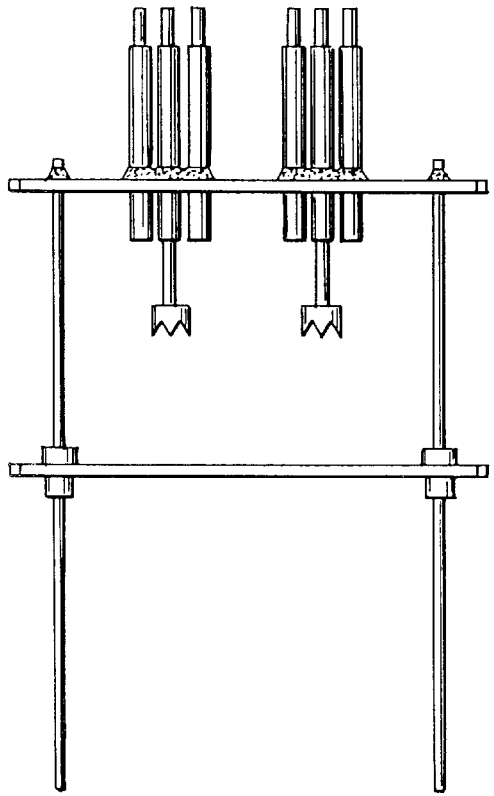

FIGS. 10, 11 and 12 illustrate the embodiment 100 which is similar to the embodiment 80 shown in FIG. 9 except that the dual contact assembly at the top end is adjustable in width. More specifically, the battery 90, constructed with dual terminals at the top end, sometimes varies in width so that the battery terminal spacing is varied. The battery terminals are deployed in accordance with battery types. They can vary significantly in spacing. It is not uncommon for batteries to be made in accordance with three standards. The three standards involve positioning the battery terminals at spacings of 0.50, also 0.75 and 1.00 inches. FIGS. 10, 11 and 12 illustrate a set of contacts deployed for such variations. The embodiment 100 is constructed with three similar parallel sleeves 102 and a second set at 104. Movable contacts 106 and 108 are mounted on appropriate elongate rods 110 and 112 In FIGS. 10 they are positioned at the most narrow dimension. In FIG. 11, the spacing is intermediate while the spacing is maximum in FIG. 12. Again, the contacts are urged by springs downwardly against the battery terminals.

FIG. 12 shows the lower PCB adjusted upwardly and very close to the terminal contact assemblies. There are extremely thin batteries which are formed of sheet material. This spacing can be used to test them. For instance, film packs installed in instant cameras utilize such wide spacing for a battery which is substantially no thicker than a sheet of paper. It is equipped with a pair of spaced tabs which conform to the spacing of the contacts, and they are therefore able to test that type battery construction. Many other examples are known and :can be tested by the adjustable width battery contact assembly 100.

While the foregoing is directed to different embodiments of a battery test clamp mechanism, the scope is determined by the claims which follow.

We claim:

1. A battery test clamp comprising:
   (a) an upper board;
   (b) a lower board;
   (c) an upper battery test contact on said upper board;
   (d) a lower battery test contact on said lower board facing said upper contact; and
   (e) a set of posts connected to and extending between said boards to space said boards so that a battery can be releasably tested through said contacts, wherein said boards are spaced to enable a button type battery to contact said battery test contacts and spacing of said boards is changed by relative board movement along said set of posts.

2. The battery test clamp of claim 1 wherein said posts define a relatively rigid test clamp with said boards and said posts are movable through aligned post grips.

3. The battery test clamp of claim 2 wherein said post grips each includes a circular mounting hub for engagement with one of said boards and positioned around a post extending there through, and each grip includes inwardly directed post contacting surfaces enhancing frictional engagement so that post movement is restrained, wherein an axial dimension of said grips defines a minimum board spacing.

4. The apparatus of claim 1 wherein said boards are spaced apart by four posts, and said posts are deployed at four corners of said boards to define a rectangular battery test clamp.

5. The apparatus of claim 1 including:
   (a) a test circuit connector mounted on one of said boards;
   (b) a board supported conductor path extending to said connector and also extending to said battery test contact on said board to make electrical connection therewith; and
   (c) a conductor flow path on the other of said boards extending from the contact thereon.

6. The apparatus of claim 5 wherein said connector includes one terminal connected electrically with one of said posts to define a current flow path from the other of said boards.

7. The battery test clamp of claim 1 wherein said upper and lower boards are printed circuit boards, and said upper and lower battery test contacts are aligned opposite one another to enable a battery to be inserted between said battery contacts, and at least one of said battery contacts is movable to extend operatively against a battery terminal and to contact said with pressure controlled by a spring.

8. The battery test clamp of claim 7 wherein said test contacts connect on said boards to electrical current flow paths on said boards.

9. The battery test clamp of claim 7 wherein one of said test contacts is relatively movable.

10. The battery test clamp of claim 1 including a current flow path there through wherein the flow path begins and ends at a connector mounted on one of said boards and serially connects through:
   (a) a terminal at said connector;
   (b) a current flow path from said connector and the board on which said connector is mounted extending to the contact supported by said board;
   (c) a current flow path from said remaining battery test contact;
   (d) a current conductive mounting hub engaging at least one of said set of posts to complete a circuit there through;
   (e) one of said posts, and
   (f) a connection from said one post to a second terminal in said connector.

11. The apparatus of claim 1 wherein said upper board supports:
   (a) at least two spaced apart battery test contacts;
   (b) at least two spaced apart battery test contacts on said lower board wherein said upper and lower board battery test contacts are aligned to define at least two test modules between said boards for testing simultaneously two batteries there between; and
   (c) separate test module current flow paths connected with the separate upper and lower battery test contacts and including current flow paths through electrically dedicated and isolated posts in said set of posts.

12. The apparatus of claim 11 wherein said set of posts are electrically connected in said separate test modules.

13. A battery test clamp comprising:
   (a) an upper test board;
   (b) a lower test board;
   (c) a set of posts extending between said boards to space said boards so that a battery can be releasably positioned between said boards for testing;
   (d) first and second board mounted battery test contacts operatively engaging a pair of spaced battery terminals of a battery undergoing tests; and
   (e) a set of board mounted post grips aligned with and gripping said set of posts so that said battery test clamp is a rigid structure sized to accommodate a selected battery size positioned between said boards, and said boards are selectively and controllably movable to adjust a different size battery on relative movement of said boards with respect to said set of posts, and, wherein said battery test contacts are resiliently urged to engage said battery terminals with contact pressure.

14. The battery test clamp of claim 13 wherein said first and second battery test contacts are mounted on one of said boards and are spaced on said board to thereby position said battery test contacts at a spacing in accordance with an industry standard to make contact against a battery having terminals thereon in accordance with said industry standard.

15. The battery test clamp of claim 14 wherein said battery test contacts both comprise movable contacts mounted in first or second differently spaced battery contact sleeves for adjustments in spacing.

16. The battery test clamp of claim 13 wherein said set of posts and said set of post grips are relatively positioned on said upper and lower test boards for alignment to define a rigid structure, and said post grips permit sliding frictional movement to accommodate changes in spacing between said boards.

17. The battery test clamp of said 13 including a connector assembly on one of said boards, and wherein said first and second battery test contacts are mounted on the same board to enable electrical connection on that board to said connector.

18. The battery test clamp of claim 13 wherein said post grips each includes a circular mounting hub for engagement with one of said boards and positioned around a post extending there through, and each grip includes inwardly directed post contacting surfaces enhancing frictional engagement so that post movement is restrained.

19. The apparatus of claim 13 wherein said boards are spaced apart by four posts, and said posts are deployed at four corners of said boards to define a rectangular battery test clamp.

20. The apparatus of claim 13 including:
   (a) a test circuit connector mounted on one of said boards;
   (b) a board supported conductor path extending to said connector and also extending to said battery test contact on said board to make electrical connection therewith; and
   (c) a conductor flow path on the other of said boards extending from the contact thereon.

* * * * *